(12) United States Patent
Hunter et al.

(10) Patent No.: US 9,303,328 B2
(45) Date of Patent: Apr. 5, 2016

(54) SYSTEM AND METHOD FOR ELECTROPLATING OF HOLE SURFACES

(71) Applicant: Teledyne Instruments, Inc., Thousand Oaks, CA (US)

(72) Inventors: John Bradley Hunter, Basking Ridge, NJ (US); Chester P. Piechowiak, Ormond Beach, CA (US); Theodore M. Heummler, Eliot, ME (US)

(73) Assignee: Teledyne Instruments, Inc., Thousand Oaks, CA (US)

( * ) Notice: Subject to any disclaimer, the term of this patent is extended or adjusted under 35 U.S.C. 154(b) by 228 days.

(21) Appl. No.: 14/151,532

(22) Filed: Jan. 9, 2014

(65) Prior Publication Data

US 2015/0191844 A1     Jul. 9, 2015

(51) Int. Cl.
| | |
|---|---|
| *C25D 17/00* | (2006.01) |
| *C25D 21/02* | (2006.01) |
| *C23C 18/16* | (2006.01) |
| *C25D 17/12* | (2006.01) |
| *C25D 5/04* | (2006.01) |
| *C25D 5/02* | (2006.01) |

(Continued)

(52) U.S. Cl.
CPC ............... *C25D 17/12* (2013.01); *C25D 5/026* (2013.01); *C25D 5/04* (2013.01); *C25D 5/08* (2013.01); *C25D 7/04* (2013.01); *C25D 17/004* (2013.01); *C23C 18/1653* (2013.01); *C25D 21/02* (2013.01)

(58) Field of Classification Search
CPC ...... C25D 17/12; C25D 17/004; C25D 17/10; C25D 5/04; C25D 5/026; C25D 5/08; C25D 7/04; C25D 21/02; C25D 21/10; C23C 18/1653

See application file for complete search history.

(56) References Cited

U.S. PATENT DOCUMENTS

| | | | | |
|---|---|---|---|---|
| 1,953,955 | A |   | 1/1932 | Crouch |
| 3,645,855 | A | * | 2/1972 | Wisman ................. H05K 3/225 204/222 |
| 3,941,312 | A | * | 3/1976 | Ohno .................... B41J 2/1606 239/102.1 |

(Continued)

FOREIGN PATENT DOCUMENTS

GB        2318588 A       4/1998

OTHER PUBLICATIONS

International Search Report and Written Opinion for International Application No. PCT/US2015/010249 mailed on Jul. 13, 2015 in 31 pages.

(Continued)

*Primary Examiner* — Luan Van
*Assistant Examiner* — Louis Rufo
(74) *Attorney, Agent, or Firm* — Procopio Cory Hargreaves & Savitch LLP

(57) ABSTRACT

An electroplating system and method has a needle anode associated with an XYZ or multi-direction positioning device and is configured for plating internal surfaces of holes in metal products. The needle anode is positioned such that an insertion portion of the needle anode is centered over a hole and inserted to a predetermined depth in the hole, with a discharge end located a predetermined distance from the inner end of the hole. Plating solution is supplied to the needle anode and flows continuously during plating from the discharge end of the needle, through a gap between the needle anode and inner surface of the hole, and out of the open end of the hole into a drain. In one example, the metal object is a terminal of an electrical connector and the hole is a solder cup at a terminal end of the connector.

24 Claims, 8 Drawing Sheets

(51) Int. Cl.
*C25D 5/08* (2006.01)
*C25D 7/04* (2006.01)

(56) References Cited

U.S. PATENT DOCUMENTS

| | | | |
|---|---|---|---|
| 4,687,562 A | 8/1987 | Smith et al. | |
| 4,911,813 A | 3/1990 | Wagner | |
| 4,921,583 A * | 5/1990 | Sewell | C25D 5/026 204/206 |
| 5,372,700 A | 12/1994 | Pilorge et al. | |
| 5,527,445 A | 6/1996 | Palumbo | |
| 5,865,976 A * | 2/1999 | Takeuchi | C23C 4/121 205/109 |
| 6,103,076 A | 8/2000 | Mizuno | |
| 7,842,170 B1 | 11/2010 | von Detten | |
| 8,173,538 B2 | 5/2012 | Feustel et al. | |
| 2007/0298186 A1 | 12/2007 | Yang | |
| 2008/0006526 A1 | 1/2008 | von Detten | |
| 2008/0237048 A1 * | 10/2008 | Emesh | C25D 5/04 205/50 |
| 2013/0020193 A1 * | 1/2013 | Ho | C25D 17/001 204/278 |
| 2014/0190835 A1 * | 7/2014 | Kojima | C25D 17/00 205/148 |

OTHER PUBLICATIONS

Invitation to Pay Additional Fees for International Application No. PCT/US2015/010249 mailed on May 7, 2015 in 11 pages.

* cited by examiner

SYSTEM AND METHOD FOR ELECTROPLATING OF HOLE SURFACES

BACKGROUND

1. Field of the Invention

The present invention relates generally to an electroplating system and method for electroplating a deposit of metal onto the internal surface of a closed or open hole or other cavity in a workpiece of conductive or partially conductive material, and is particularly concerned with electroplating holes or cavities of high aspect ratio, i.e. holes which are deep compared to their diameter, such as solder cups of electrical terminals of electrical or hybrid electrical and optical connectors.

2. Related Art

Electroplating is a process that uses electrical current to reduce dissolved metal cations to form a metal coating on an electrode. Conventionally, the process involves immersing the part to be plated and an anode (made of the metal to be plated on the part or a noble metal) in a bath or electrolyte solution containing one or more dissolved metal salts as well as other ions that permit the flow of electricity. The part to be plated acts as the cathode of the circuit. As power is supplied to the circuit, metal atoms dissolve in the solution from the anode and are reduced at the interface between the solution and the cathode, such that they "plate" onto the cathode.

For example, electrical and electronic assemblies of instruments and controls are often supplied with electrical connections in the form of metal contact pins (and sockets). The inboard end (i.e., opposite the mating end) of the pins (and sockets) are typically intended for solder connections to electrical wiring. In particular, the soldering operations include soldering the termination of an electrical wire into a "cup" receptacle of the electrical connector thus forming the electrical couple therebetween.

For high reliability applications, the ability to perform the soldering operations (e.g., connecting conducting lines to connector terminals) must be assured, even after long storage of the assemblies and components. To illustrate, if the pins are composed of nickel, stainless steels or other metals that strongly passivate by forming a tough surface oxide layer, they become difficult to solder unless the surface oxide formation is inhibited. Thus, for high reliability applications, the soldering surfaces of such pins are usually provided in an oxide free state that is protected by the pre-soldering application of a layer of gold plating, deposited by electrochemical or other means. If the gold plating is adequately thick (e.g., exceeding approximately 30 micro-inches) and non-porous, it may prevent oxidation of the soldering surface beneath it until the soldering operation is performed. The gold or other plating metal is typically dissolved into the solder alloy during the solder operation and plays no further electrical or mechanical role in the formation of the joint, as long as the concentration of the gold in the solder is not excessive.

Conventionally, the initial plating operations for the finishing of pins featuring solder cups can be performed in several ways. As described above, pins can be electrodeposited with rack or barrel plating fixtures, wherein the pins or the connector assembly is placed in a bath of plating solution. The parts to be electroplated are connected electrically to an electrical power supply negative terminal (−). The bath also contains anodes, connected to the power supply positive terminal (+). The anodes may be of two types: consumable anodes and noble material anodes. Consumable anodes are eroded by the passage of plating current and dissipate into the solution, replacing the metal ions that are deposited on the workpiece. Noble anodes consist of platinum, titanium or similar metal, possibly with coatings applied, or carbon. They do not erode and do not replace the metal ions lost in the process. In this case, the deposited metal is supplied directly from the solution. Electroless plating may also be used, in which the surfaces to be plated are treated with a series of solutions that alternatively activate the surface and then deposit metal on it.

While electroplating in a plating solution bath is adequate for many workpiece geometries, electroplating a uniform deposit in deep hole is difficult if the holes are deep compared with the diameter, referred to as a high aspect ratio. The current flow required for metal deposit is hampered by the longer travel distance required for it to reach the bottom of the hole. The current seeks the closer surface in the travel through the solution, rather that reach the deeper surfaces of the hole. The metal plating therefore plates more heavily on the surfaces near the entrance of the hole, leaving an insufficient deposit at the bottom. The deposition is further hindered by stagnation of plating solution deep in the hole. Careful agitation and fluid flow is required to replenish the spent solution at the bottom of the hole after the latent metal has been deposited from it. Moreover, these challenges are exacerbated in smaller geometries such as commonly found in electronics, electrical connectors, and the like, and solder cups of electrical connectors and the like are often deep enough to present difficulty with obtaining a good metal deposition to the bottom of the cup. This can result in a protective layer which is too thin or poorly adherent, as a result of the features and geometry of the high aspect ratio, deep hole or solder cup.

Additionally, re-plating of holes or cavities with poor or ineffective coating or solder layers in an electroplating bath is generally not feasible for components already assembled into a finished product, such as solder cups of pins already incorporated in an electrical instrument assembly, because the complete assemblies cannot be subjected to the chemicals and temperatures typical of the electroplating process. Thus, such assemblies cannot be immersed in a plating tank or barrel.

SUMMARY

In one aspect, an electroplating apparatus or system and method is provided for electroplating an interior surface of a blind hole or cavity in a workpiece which is formed at least partially of metal or other conductive material. The system and method is designed for electroplating interior surfaces of a hole or cavity having a relatively high aspect ratio, i.e. where hole or cavity depth is high relative to hole or cavity diameter or cross-sectional dimension.

In one aspect, an apparatus or system for electroplating an interior surface of a conductive cavity in a workpiece comprises a tubular anode or needle-like anode having a first end and a second end, the second end comprising a discharge outlet for discharge of plating solution flowing through the tubular anode, a cathode contact configured for electrical connection to the workpiece or a conductive part of the workpiece having a cavity with an interior surface to be plated, a plating power supply electrically connected between the anode and cathode contact, a positioning device configured for positioning at least an end portion of the tubular anode through an open end of the cavity into an operative, coaxial position in the cavity spaced from the interior surface and an inner end of the cavity to define a flow path for plating solution between the discharge outlet and inner end of the cavity, through an annular space between the interior surface of the cavity and the tubular anode, and out of the open end of the cavity, a supply of plating solution connected to the first end of the tubular anode, and a spent plating solution collection device positioned beneath the open end of the cavity for collection of spent plating solution flowing out of the open end of the cavity. In this apparatus, plating solution flows through the tubular anode, out of the discharge outlet, through an annular space between the tubular anode and an interior surface of the cavity to be plated, and out of an open end of the cavity along the discharge flow path, and metal is deposited from the flow of plating solution onto the interior surface of the cavity.

The tubular anode is of predetermined dimensions relative to the hole or cavity to be plated and an insertion portion of the tubular anode is configured to be inserted in the hole with an annular gap of predetermined width between the tubular anode and the opposing internal surface of the hole or cavity and the discharge or second end of the tubular anode at a predetermined spacing from the inner end of the hole or cavity. The insertion portion may comprise a major portion of the length of the tubular or needle anode.

In one embodiment, the electroplating system is designed for electroplating holes or blind bores of electrical terminals or pins, such as solder cups to which electrical leads are to be soldered, but it may also be used for electroplating of the inner end and sides of a closed or open hole or other cavity in any metal or part-metal object or workpiece. In a system for electroplating the inner surfaces of solder cups of plural pins of a connector assembly, the spent plating solution collection device comprises a tray or basin of non-conductive material which is at least partially elastomeric, and has a base wall and a peripheral rim. A series of holes are provided at predetermined locations in the base wall for sealing engagement around the outer surfaces of the respective pins at a spacing below the open ends of the solder cups. In one embodiment, masking sleeves of non-conductive material engage over the outer surface of the respective pins between the open outer end of the pin and the base wall of the basin. This masking arrangement may not be necessary for initial production plating, but is particularly advantageous when re-plating solder cups in a finished electrical assembly, so as to protect sensitive components in the assembly connected to the pins. In this case, exposure to plating solutions only occurs where it is needed, inside the solder cup, and all other surfaces of the pin are masked The masking sleeves may be separate from the base wall of the basin or formed integrally with the base wall. In one embodiment, an outlet passageway is provided in the base wall of the basin for directing spent plating solution away from the basin and into a suitable collection or disposal device.

According to another aspect, a method for electroplating an interior surface of a blind hole in a workpiece formed at least partially of conductive material is also disclosed herein. The method includes electrically coupling a current supply to the workpiece, and electrically coupling the current supply to an electroplating anode, the electroplating anode including a plating solution inlet, a discharge outlet, and a passageway extending between the plating solution inlet and the discharge outlet. The method further includes inserting a portion of the electroplating anode extending up to the discharge outlet within the interior surface of the blind hole, and fluidly coupling a plating solution supply to the discharge outlet via the plating solution inlet and the passageway, whereby plating solution flows from the plating solution supply through the internal passageway, out of the discharge outlet, and through the gap between the interior surface of the blind hole and the outer surface of the inserted portion of the anode out of the open upper end of the hole. An electric current is established between the interior surface of the blind hole and the electroplating anode through the plating solution such that metal is liberated from the plating solution and attaches to the interior surface of the blind hole.

The continuous flow of plating solution through the space between the needle or tubular anode and the internal surfaces of the cavity and hole provide a continuous source of metal so that the plating operation need not be interrupted until metal deposition is complete. The system and method described above is particularly helpful for plating of holes or cavities of high aspect ratio (depth relative to cross-sectional dimensions) which are difficult to plate using conventional techniques. In one aspect, the system and method may be used for restoring or reworking electroplated nickel layers in solder cups at the ends of pins of connectors incorporated in completed instrument assemblies when the original layers are too thin or poorly adherent so that proper soldering to electrical wires or leads cannot be achieved. It may alternatively be used for production plating of deep holes in terminal pins or other metal objects, and is not limited to rework of faulty components.

Other features and advantages of various embodiments will become more readily apparent to those of ordinary skill in the art after reviewing the following detailed description and accompanying drawings.

BRIEF DESCRIPTION OF THE DRAWINGS

The details of various embodiments of an electroplating system and method for high aspect ratio inner surfaces, both as to structure and operation, may be gleaned in part by study of the accompanying drawings, in which like reference numerals refer to like parts, and in which.

DETAILED DESCRIPTION

Figure 1:
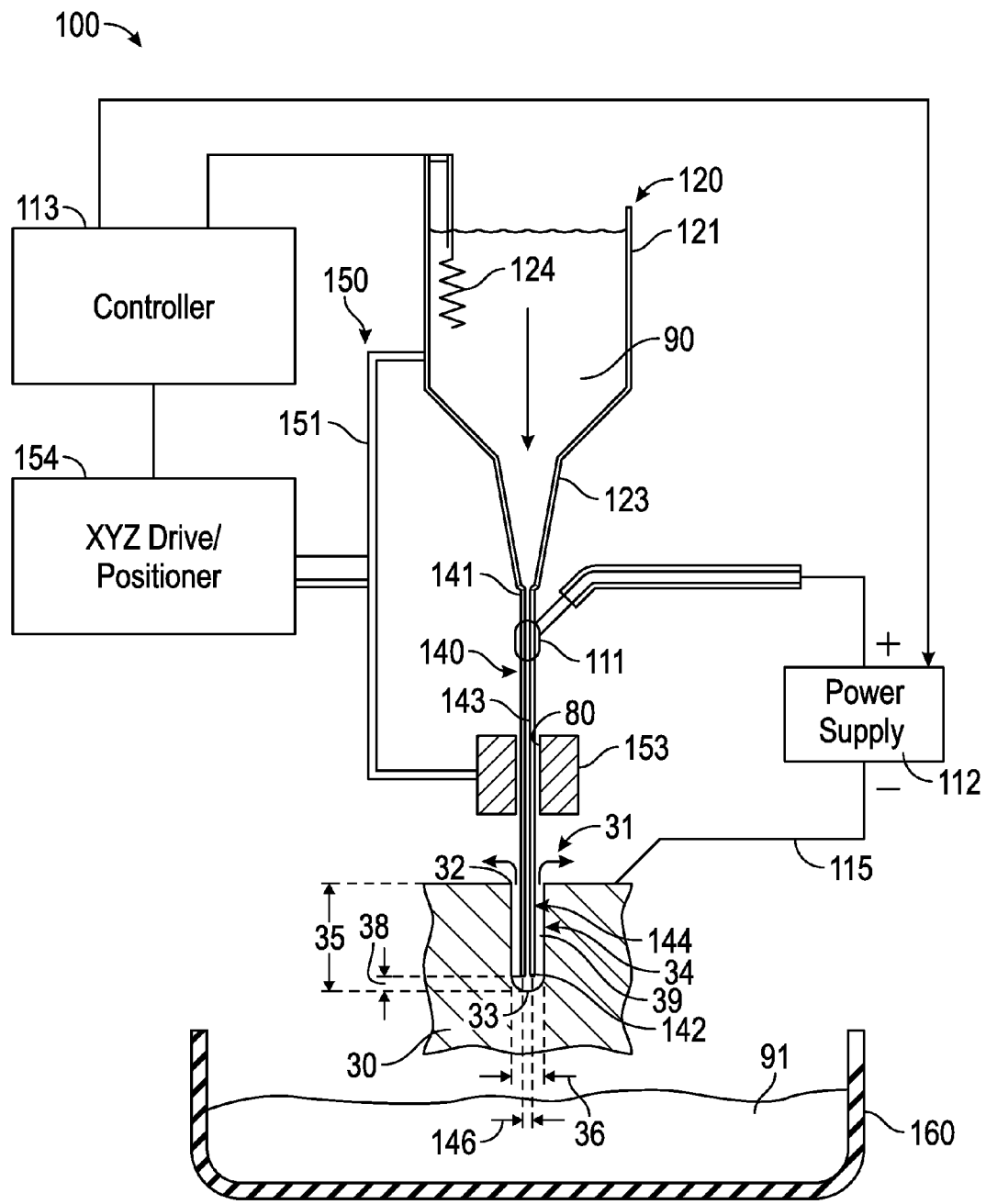
FIG. 1 is a schematically illustrated vertical cross-sectional view of one embodiment of an electroplating system for use in electroplating a high aspect ratio hole.

The present disclosure relates to an electroplating system and method in which components having an internal surface or cavity with a high aspect ratio may be more uniformly and thoroughly plated. Embodiments provide for a deposit of nickel, gold or other metal to be made onto the surfaces on the bottom and sides of a closed or open hole or other cavity in a workpiece which may be a metal or partially metal object. For example, a nickel or gold layer can be deposited in the solder cups of connector pins or terminals in a multiple contact connector unit. The deposit may be made during initial production of connector assemblies or the like, or for reworking or restoring previously electroplated solder layers in solder cups of finished electrical instrument assemblies or the like which have insufficient nickel and/or gold deposition to provide for soldering capability. The electroplating system and method utilizes a unique hollow anode geometry that both provides for uniform plating current and plating solution replenishment. Here, the electroplating system and method may also successfully restore the electroplated nickel layers on affected pins on completed instrument assemblies. Although applicable to electroplating during production of electrical pins and connectors, the electroplating system and method is generally applicable to production plating of solder cups in electrical connector assemblies or deep holes or cavities in other metal products.

Although the embodiments described below and illustrated in the drawings are concerned with electroplating the internal surfaces of blind holes or cavities, it will be understood that the same method and apparatus may be used for electroplating an open hole or through bore, with suitable plugging of one open end of the hole.

FIG. 1 is a schematically illustrated cutaway side view of one embodiment of an electroplating system. In particular, the illustrated electroplating system 100 is applicable to plating of an exemplary blind hole 31 in a workpiece 30 which is at least partially of metal or which contains metal components. Here, the blind hole 31 is generally a cavity having an open end 32 and a closed terminal end 33, and the interior surface 34 of the cavity may be electroplated using the system 100. For example, here, the blind hole 31 is illustrated as blind drill hole, wherein the interior surface 34 includes a cylindrical bore that transitions into a shaped terminal end.

The disclosed electroplating system 100 is configured to plate the interior surface 34 of a cavity that is deep and narrow (i.e., has a small cross section). In particular, the cavity may have a characteristic aspect ratio that is generally the ratio of its depth 35 to its width 36. For example, here with the blind hole 31 represented as a drill hole, the depth 35 may be measured as the full diameter depth (neglecting nominal drill tip depth), and the width 36 may be measured as diameter of the bore. According to one embodiment, the electroplating system 100 may be configured for a cavity or blind hole having an aspect ratio which exceeds 2.0, and particularly where the hole aspect ratio exceeds about 2.25. In addition, the electroplating system 100 may be configured for a cavity having a width or diameter 36 of less than around 6.4 mm (0.25 inch).

Additionally, this particular configuration is merely for illustration purposes, as the illustrated electroplating system 100 may be configured for any combination of singular or plural plating operations (e.g., single or multiple blind holes 31), and individual or concurrent plating operations (e.g., single or multiple needle anodes 140). Also, here and in other figures, various components and surfaces have been left out or simplified for clarity purposes and ease of explanation.

Generally, the electroplating system 100 includes an electric current or plating power supply 112, a plating solution supply 120, an electrically conductive tubular anode or "needle" anode 140 of conductive material having a through bore or passageway 143, a positioning system or device 150, and a spent plating solution drain or collection device 160, which may be a suitably sized drain tray or basin. The dimensions of the needle anode 140 are selected based on the dimensions of the hole or holes 31 to be plated, and needle anodes of different dimensions may be provided for connection in the electroplating system for plating holes of different sizes. In the illustrated embodiment, the plating solution supply comprises a reservoir 121 which may be manually filled with plating solution 90 or supplied with plating solution via a pump or the like.

In one embodiment, system 100 is positioned as illustrated in FIG. 1 with collection device 160 suitably supported in a fixed position beneath the needle anode 140, for example on top of a support surface (not illustrated). A workpiece 30 having one or more holes 31 to be plated is supported in a fixed position beneath the needle anode and above spent plating solution collection device 160 by any suitable support mechanism, such as a product conveyor, insulated holding fixture or the like. The workpiece 30 to be plated is not illustrated in detail, and only part of the workpiece including hole 31 is illustrated in FIG. 1, but the workpiece may be any metal or partially metallic object or device having one or more high aspect ratio holes of conductive material requiring internal plating, for example solder cups of connector pin and socket terminals of a connector device, vias in printed circuit boards, or the like.

The reservoir 121 is similar to the syringe of a needle, and has a funnel shaped outlet 123 suitably secured to an inlet end 141 of needle anode through bore 143, for example via an annular elastomeric washer sealed between telescopically engaged ends of outlet 123 and inlet 141. In the illustrated embodiment, an optional heater 124 is located in reservoir 121 for heating the plating solution as needed, depending on the plating solution used. The plating power supply has a positive terminal connected to the needle anode via coupler 111, and a negative terminal suitably connected via lead 115 to a conductive portion of workpiece 30.

The reservoir and needle anode are suitably mounted via a support system which may comprise a support frame 151 which includes a platform or guide member 153 of non-conductive material such as plastic spaced beneath reservoir 121 and having a guide hole or through bore 80 through which needle anode 140 extends. The support system 150 is generally a structural support between the needle anode 140 and the interior surface 34 to be electroplated and includes means for providing alignment, positioning, and relative motion or displacement between the needle anode 140 and the interior surface 34 to be electroplated. In the illustrated embodiment, the workpiece or object 30 having one or more holes to be plated is supported in a fixed position in any suitable manner during plating, while the needle is inserted into a suitable position in hole 31 prior to each plating procedure. However, the support for workpiece 30 may alternatively be moved relative to the needle anode 140 to position the anode in the hole in other embodiments.

The support frame 151 is not shown in detail, but it will be understood that any suitable support mechanism may be used for supporting the electroplating system and workpiece to be electroplated during an electroplating procedure. In the illustrated embodiment, the reservoir and needle may be mounted together on a suitable support frame. In one embodiment, the support frame 151 is associated with an XYZ positioner or three axis positioning system 154 which drives the frame and attached needle anode 140 in X, Y and Z directions in order to position an insertion portion 144 of the needle protruding out of guide hole 80 inside a hole or cavity 31 of a metal object or workpiece 30 to be plated, as described in more detail below. In one embodiment, guide member 153 may be part of an XYZ stage of XYZ positioner 154. Controller 113 is connected to XYZ positioner or drive assembly 154 as well as power supply 112 and heater 124 for controlling positioning of needle anode 140 and associated components prior to plating as well as turning power supply 112 and heater 124 on and off as necessary. The controller 113 may have a manual input for operator control of the plating process, or may be suitably programmed for automatic control of the system and positioning of the needle anode, as discussed in more detail below.

In FIG. 1, the electroplating system 100 is illustrated with the lower portion of the needle anode positioned inside hole 31 ready for a plating operation. The positioning device, which may be a conventional XYZ positioning system, is configured or controlled to insert the needle anode centrally or coaxially to a predetermined depth into the hole 31 as illustrated in FIG. 1, so as to leave a predetermined gap 38 between the outlet end or discharge opening 142 of the needle anode 140 and the terminal end 33 of the blind hole 31) and a predetermined annular gap or spacing 39 between the outer surface of needle anode 140 and the inner surface 34 of the hole.

During plating operations, the needle anode 140 is mechanically coupled to the positioning device 150, electrically coupled to the electric current supply 112, and is fluidly coupled to the plating solution supply 120. Also, during plating operations, the component to be plated (workpiece 30) is electrically coupled to the electric current supply 112 such that the interior surface 34 of blind hole 31 operates as an electroplating cathode. In FIG. 1, the electroplating system 100 is illustrated in a state where plating solution 90 is flowing through a discharge outlet 142 of the needle anode 140, around the needle anode 140, and out of the open end 32 of the blind hole 31.

Power supply 112 may be a conventional electroplating DC power supply of sufficient voltage and current for a given electroplating process. In use, power supply 112 forms an electroplating circuit with the needle anode 140 and workpiece 30 such that its blind hole 31 is the electroplating cathode, as indicated in FIG. 1.

According to one embodiment, the electric current supply 112 may be removably coupled to the needle anode 140. For example, the anode coupler or contact 111 may be a contact band, such as a spring-loaded contact from a small electrical connector pin (e.g., similar diameter as the needle anode 140), which is modified to form an electrical couple with the needle anode 140. A wire may also be soldered to the contact band to then connect to the DC power supply 112. Alternately, the electric current supply 112 may be integrated with the needle anode 140 (e.g., direct soldered connection). Additionally, the power supply 112 may be turned on and off by electroplating controller 113, or may be manually turned on and off by the operator, and may be included in the housing or support frame 151 of the other electroplating components illustrated.

The plating solution supply 120 communicates with the inlet end 141 of needle anode for delivering the plating solution 90 for the electroplating process to the needle anode 140. In the illustrated embodiment, plating solution 90 is gravity fed from reservoir 121 through the through bore in needle anode 140, and the supply in reservoir 121 may be replenished manually or automatically via a pump or the like. In alternative embodiments, plating solution 90 may be actively fed to the needle anode by a suitable solution delivery mechanism including one or more active devices such as pumps, control valves, switchable manifolds, etc. or any combination thereof.

According to one embodiment, the plating solution 90 may be passively-fed to the needle anode 140. In the illustrated embodiment, the reservoir 121 is positioned above the needle anode 140 such that the plating solution 90 is gravity-fed to the needle anode 140. In one embodiment, the reservoir 121 may be embodied as a large (e.g., 60 ml) syringe, open at the top, may be connected to the needle anode 140 via a small silicone rubber tube (not illustrated) attached to the bottom or delivery end of the syringe. The attached tube is fitted tightly or sealingly coupled over the interfacing inlet end of the needle anode 140.

This configuration is beneficial in that it is both simple, cost effective, and agile, providing for ease of movement in the case plural blind holes 31. In this configuration, an insertion portion of needle anode 140 may be easily maneuvered into and out of one or more blind holes 31. Moreover, the open top configuration allows for a manually refreshed gravity feed that does not require being plumbed to a large tank, electrical pumps, and other large apparatus, which may be beneficial in field or rework operations. In alternative embodiments where multiple blind bores in a workpiece are to be plated, a plurality of needle anodes may be provided in a configuration matching that of the workpiece bores, so that each bore is plated simultaneously rather than moving a single anode from bore to bore as described below in connection with the illustrated embodiments. However, the single needle anode system is more flexible since the positioning system can be programmed for different numbers and arrangements of holes to be plated.

According to one embodiment, and as discussed below, plural plating solutions 90 may be supplied by the plating solution supply 120. In particular, a first plating solution 90 may be used for a first plating operation (e.g., pre-plate), and a second plating solution 90 may be used for a second plating operation (e.g., full plate). For example, the reservoir 121 may be a single-solution reservoir supplied with the different plating solutions 90 separately as needed in the plating cycle. Alternately, the reservoir 121 may be a plural-solution reservoir configured to contain the different plating solutions 90 individually (e.g., in different compartments) with a flow separator such as a selectable flow valve to control flow from the different reservoirs.

The plating solution heater 124 may be controlled to maintain the plating solution 90 at a predetermined temperature or within a predetermined temperature range, so that it flows easily through the needle anode and out through the annular space between the needle anode and hole in which the anode is inserted. For example, the plating solution heater 124 may include an immersion heater within the plating solution reservoir 121 and configured to heat the plating solution 90 directly. The plating solution heater 124 may alternatively comprise an external heater configured to indirectly heat the plating solution 90 through the wall of reservoir 121 or another part of the plating solution supply. In this way, the plating solution 90 may be maintained at temperature above ambient conditions and provide for a greater range of plating solutions 90 and greater plating flexibility. The plating solution heater 124 may be configured to maintain the plating solution 90 at a high temperature (e.g., 75 degrees C.) during plating operations. A temperature sensor (not illustrated) may be provided for monitoring plating solution temperature, with an output connected to controller 113.

The plating solution drain 160 may comprise a suitable drain basin or catch tray positioned beneath workpiece 30 with the hole or holes to be plated, and positioned for receiving and collecting spent plating solution 91 flowing out of the open upper end 32 of the hole to be plated during plating operations. The spent plating solution 91 collected in catch tray or basin 160 or the like may be suitably discarded between plating operations. At least a portion of the plating solution drain 160 may be non-conductive. For example, all or part of the plating solution drain or basin 160 may be made of a non-conductive elastomeric material. Although the plating solution drain or collection basin 160 is schematically illustrated as a freestanding catch basin, the plating solution drain 160 may interface with the metal object having a hole to be plated in certain embodiments, as discussed below in connection with FIGS. 2 and 3.

The needle anode 140 is generally a tubular electrical anode for introducing the electrical plating current whereby metal is deposited from the chemical plating solution. The hollow tube also serves to admit and replenish the plating solution 90 during the time that the plating is performed. In particular, the needle anode 140 includes a plating solution inlet 141, a discharge outlet 142, an internal passageway 143, and an insertion portion 144. All or part of the needle anode 140 may be made of a noble metal, such as platinum.

The plating solution inlet 141 interfaces with the plating solution supply and is configured to receive the plating solution 90 therefrom. The internal passageway 143 is within the needle anode 140 extending between and fluidly coupling the plating solution inlet 141 and the discharge outlet 142, and is configured to carry the plating solution 90 therebetween.

As illustrated in FIG. 1, prior to starting an electro-plating procedure for plating the inner surface of a hole 31, the XYZ drive 154 first moves the needle support frame 151 and attached components in horizontal X and Y directions until the needle anode 140 is located directly above hole 31 and centered on the central longitudinal axis of the hole. The diameter 146 of needle anode 140 is less than the diameter or horizontal cross sectional dimension of hole 31. In the case of a cylindrical hole such as a solder cup of an electrical terminal, this dimension is the hole diameter, but in the case of a non-cylindrical cavity, the horizontal cross sectional dimension is the minimum cavity width in a direction transverse to the insertion direction. The needle anode is of uniform cylindrical shape in the illustrated embodiment, but in alternative embodiments, the insertion portion only may be of uniform diameter, with other parts of the needle anode being of different diameter.

Once the needle anode is correctly positioned above hole 31, the XYZ drive 154 lowers the needle support frame 151 in the vertical or Z direction until at least part of the insertion portion 144 of needle anode 140 extends into hole 31. The depth of hole 31 may be programmed into controller 113 so that the discharge end or outlet 142 of needle anode 140 is positioned a predetermined distance 38 above the inner end 33 of hole 31. The distance or gap 38 in one embodiment may be around two needle diameters above inner end 33, and is selected such that the plating solution can flow freely into the gap and around the outer surface of the needle through the annular gap 39 between the needle anode and inner surface of hole 31.

The insertion portion 144 is operated as the electroplating anode during plating operations. In particular, the insertion portion 144 includes an electrically conductive outer surface that is electrically coupled to the electric current supply 112. According to one embodiment the insertion portion 144 may be made of metal tubing. For example, the insertion portion 144 may be made of a noble metal, such as platinum tubing. Moreover, as discussed above, the entire needle anode 140 may be a single metal tube or "needle".

The diameter and length of at least the insertion portion of the needle anode 140 are determined based on the dimensions of the hole or cavity to be plated and different needle anodes in a range of different dimensions may be provided for plating of different size holes. In one specific example, a 0.026" diameter needle of platinum or similar material with a wall thickness of 0.006" was used to plate the inside surface of a solder cup of nominal inside diameter 0.065" and a depth of 0.210". This provides an annular space or gap 39 between the needle anode and hole internal surface of around 0.02", with the needle radius being around 0.6 of the hole radius. The depth/diameter or aspect ratio of the hole was 3.2. The needle plating system may be used to plate any holes having relatively high aspect ratio (i.e. deep and narrow holes), and becomes highly advantageous when the aspect ratio exceeds about 2. In general, the needle anode plating system may be useful for plating of holes with aspect ratios in the range of around 2 to 4, with hole diameters in the range from around 0.01 inches to around 0.25 inches (existing plating techniques can be used for holes of larger diameter than this), and needle anode diameters in the range from around 0.006 inches to around 0.125 inches. In the above example, the discharge end of the needle anode was positioned 0.050" inches above the bottom of the hole, or about 2 needle diameters, or slightly less than 1 cup diameter. The ratio of the needle radius to the cup or hole radius (Rneedle/Rcup) in one embodiment is not less than 0.1, with a practical range of 0.1 to 0.6.

Positioning of the needle anode centrally at the appropriate depth in hole 31 may be accomplished automatically via controller which is suitably programmed with the fixed hole position or positions and dimensions, or may be accomplished via a manual alignment tool, guide, or blank, an alignment sensor, and alignment meter, micrometer, or the like.

Additionally, the positioner 154 may be configured to provide translational motion between a plurality of holes to be plated in a single workpiece or product 30 or multiple such products moved into position on a positioning frame or conveyor. For example, in addition to moving into and out of a first blind hole 31, the positioner or XYZ drive 154 may also move the needle anode from hole to hole and lower the needle anode into position in each new hole, for example, in a hummingbird-like manner. Multiple blind holes 31 may be accommodated in this or a like manner.

According to one embodiment, the positioning device 150 may provide for precision motion and positioning in plural directions. In particular, the positioning device 150 may comprise a plural-axis machine tool (e.g. x-y-z machine, CNC machine, etc.). For example, the support structure for the needle anode may be fixed to an XYZ head or stage of a plural-axis machine tool such that it is movable through manual or automated control. The plural-axis machine tool may include x-axis and y-axis drive micrometers, which may be configured for moving the needle anode 140 into position over each blind hole 31 for plating, and may further include a z-axis drive micrometer configured to move the needle anode 140 into and out of each blind hole 31 for plating, as described in more detail below in connection with FIG. 4.

The electroplating method will now be described in more detail. Once the insertion portion 144 of the needle anode is properly positioned in hole 31, the power supply 112 is turned on and plating solution 90 is supplied from reservoir 121 to the needle anode 140. An on off valve (not illustrated) may be provided between reservoir 121 and needle anode 140 to control supply of plating solution to the hole via needle anode 140. Plating solution 90 flows through the bore 143 of needle anode 140, out of the discharge end 142, and then outwardly from the inner end 33 of the hole and upwardly through the annular gap 39 between the anode 140 and inner surface of the hole, as illustrated by the arrows. Plating solution then flows out through the open end 32 of the hole and outwardly, as indicated by the arrows, over the edge of workpiece 30 and downwardly into the spent plating solution collection basin or drain 160.

The basic system and method of FIG. 1 may be used for production plating of holes in products such as solder cups of metal contact pins or sockets or connectors including metal contact pins and sockets prior to assembly into a final product, or other metal products having high aspect ratio holes or bores to be plated, such as printed circuit boards or the like. However, this system is only appropriate where the exposed outer surfaces of the product are not sensitive or susceptible to damage from plating solution flowing over those surfaces after exiting hole 31, or other components assembled within the product are not susceptible to damage due to differential voltages between the part being plated and an instrument case of the final product.

Figure 2:
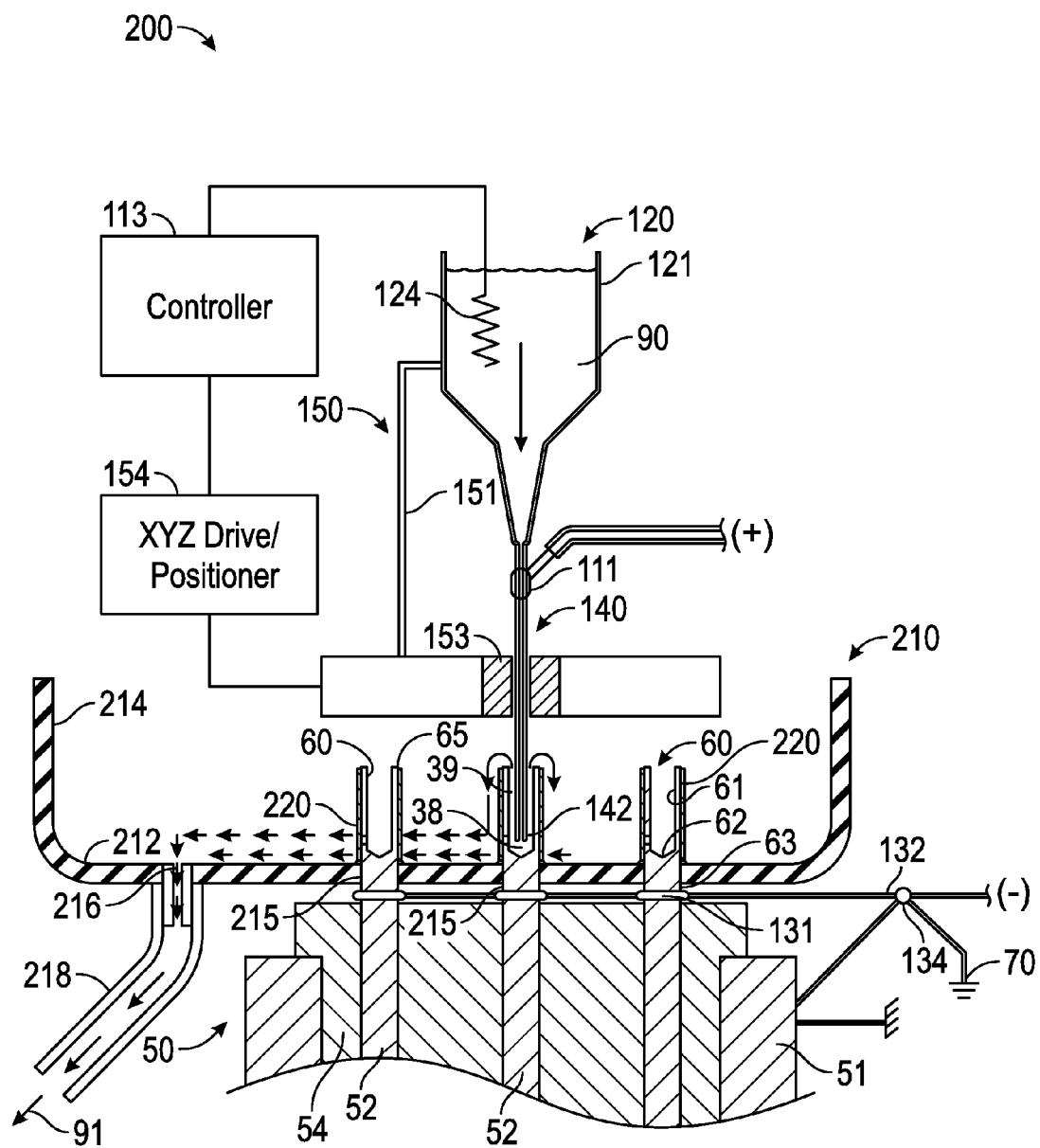
FIG. 2 is a schematically illustrated vertical cross-sectional view of a modified embodiment of an electroplating system for use in plating a solder cup of a pin of a connector unit.
Figure 3:
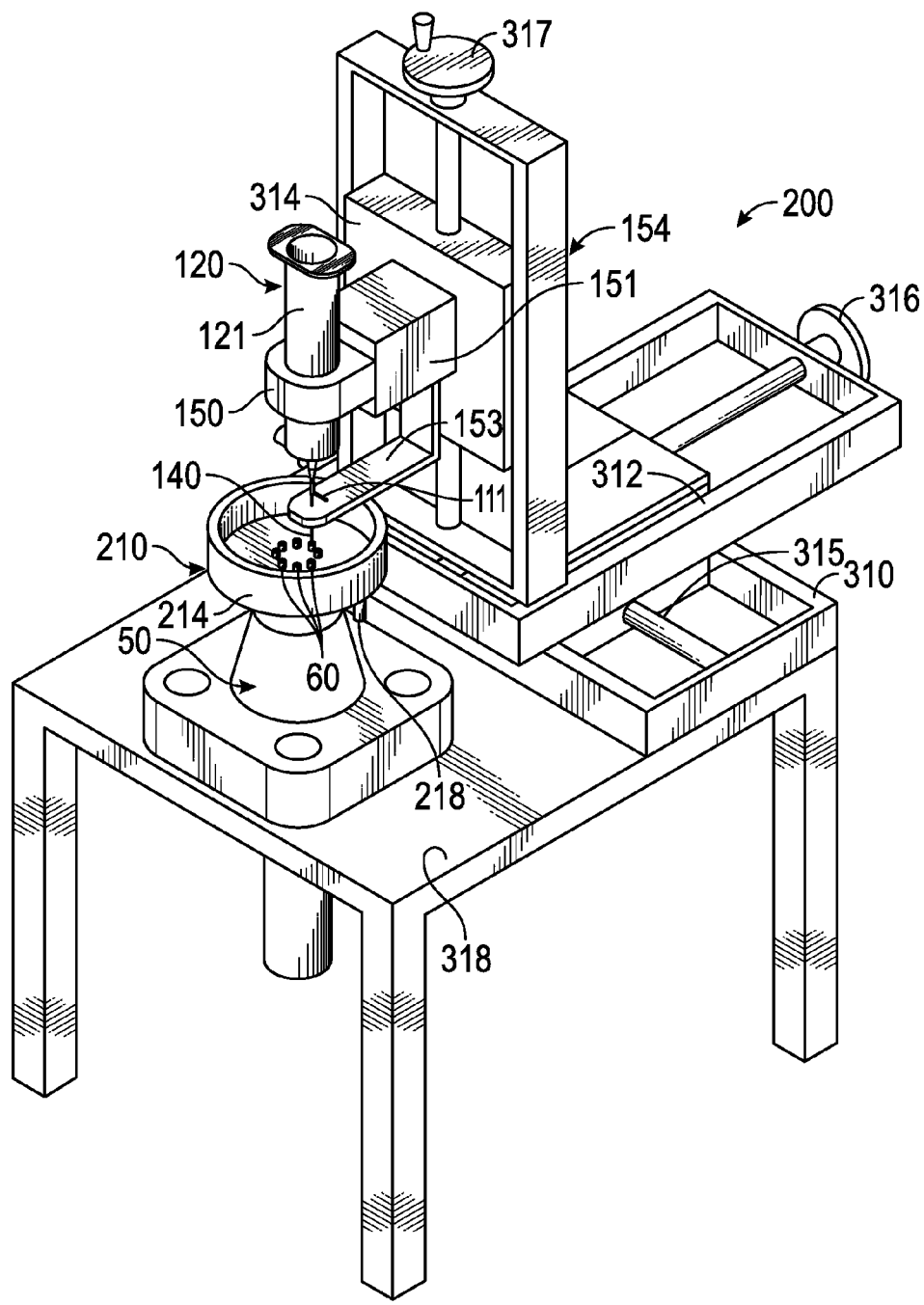
FIG. 3 is a more detailed perspective view of one embodiment of the electroplating system of FIG. 2.
Figure 4:
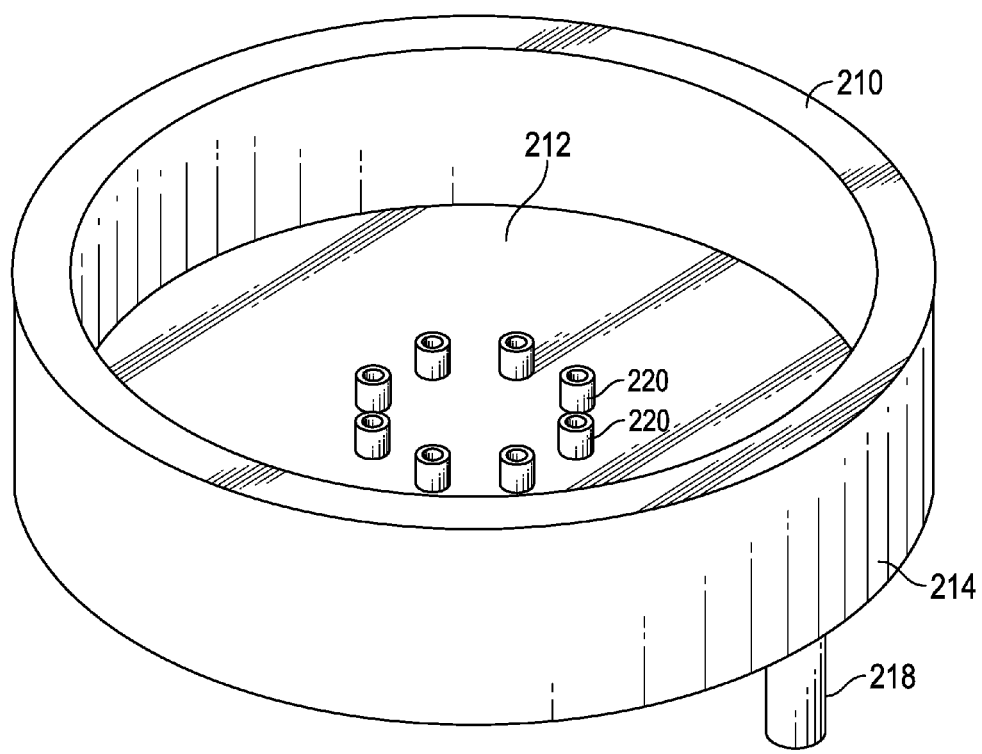
FIG. 4 is a perspective view of the solder catch basin of FIG. 3 on a larger scale.
Figure 5:
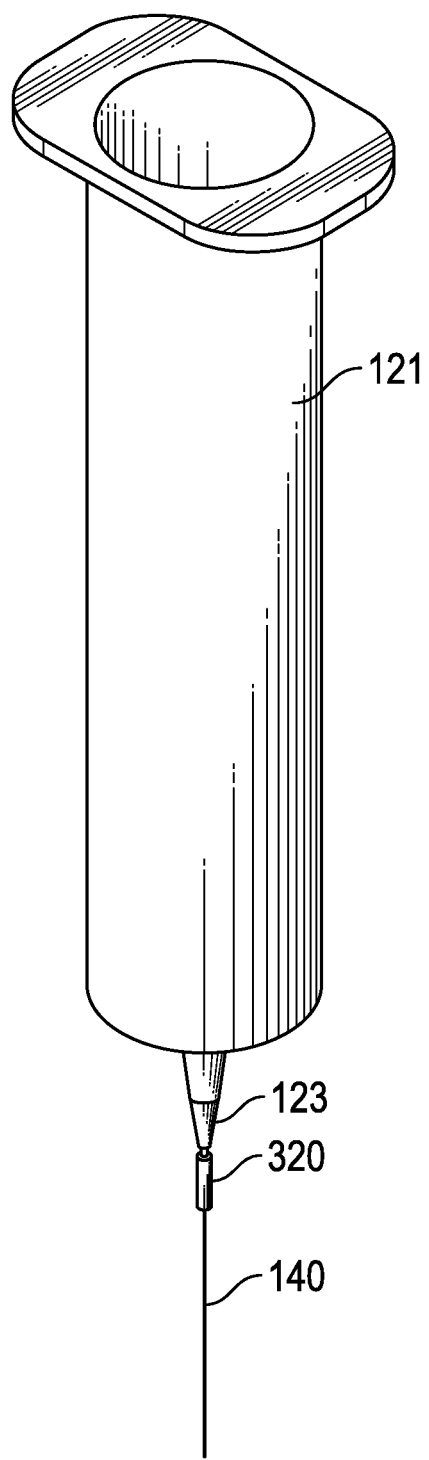
FIG. 5 is a perspective view of the syringe reservoir and needle anode of FIG. 3 on a larger scale.

FIG. 2 illustrates an embodiment of a modified electroplating system 200 which allows for protection of outer surfaces of pins of plug or receptacle contacts of a connector unit 50 while the solder cups are re-plated. FIG. 3 is a more detailed perspective view of a manually operated embodiment of the system of FIG. 2 having three axis positioning slides, as described in more detail below, while FIGS. 4 and 5 are enlarged views of the collection basin 210 and the reservoir and needle anode of FIG. 3. The systems of FIGS. 2 and 3 may be used for production plating of solder cups in a connector unit 50 alone, or may be used for reworking or re-plating of solder cups in a completed instrument or electrical assembly including connector unit 50 as well as other electrical components and circuitry within a housing or enclosure. Where system 200 is intended for reworking or re-plating of solder cups in a completed instrument, it is also modified to provide protection against differential voltages imposed between any of the connector pins or conductors 52 or between the pins and the instrument housing. Any uncontrolled differential voltages could damage sensitive electronics within the instrument housing, either rendering the instrument inoperative or liable to subsequent failure. Since the electroplating process is an electrical process, uncontrolled differential voltages of 1 to 6 volts could potentially be imposed, which is unacceptable for any sensitive components within the finished instrument module incorporating connector unit 50. Apart from the modifications for shielding outer surfaces of the pins or terminals having solder cups to be re-plated and for control against differential voltages or electrostatic damage, components of the system of FIG. 2 are otherwise identical to those of FIG. 1, and like reference numbers are used for like parts as appropriate.

Figure 6:
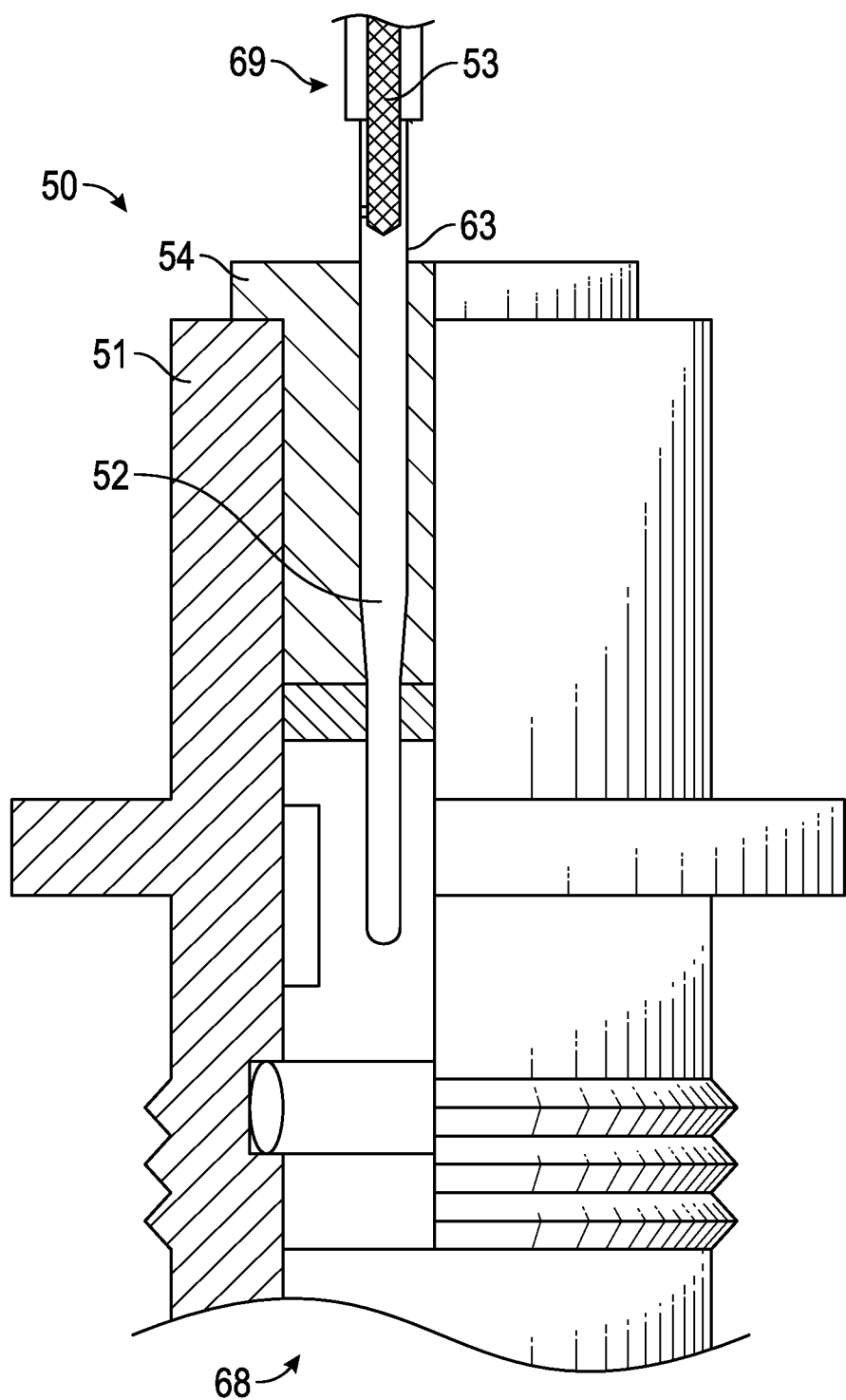
FIG. 6 is a schematically illustrated, enlarged side view of a typical electrical connector unit with solder cups which can be plated with the electroplating systems of FIGS. 1 to 5, partially sectioned to show one representative contact pin.
Figure 7:
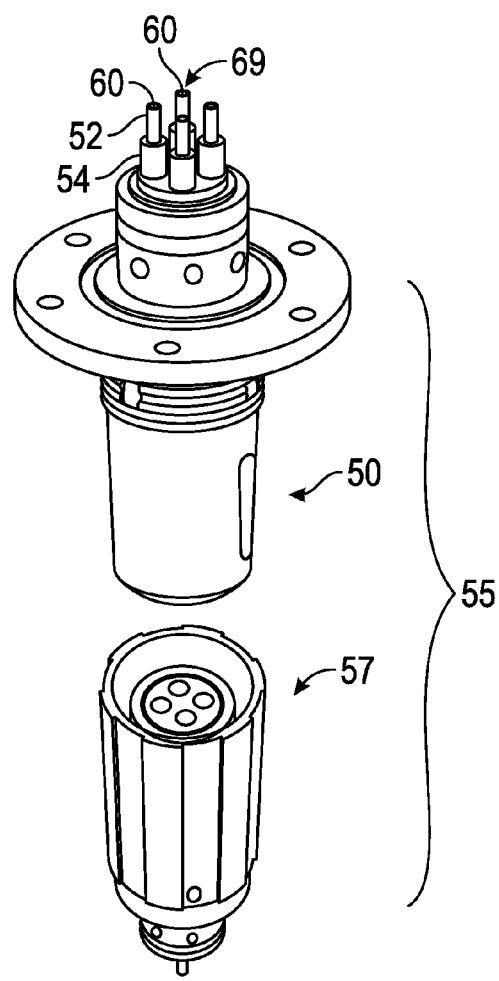
FIG. 7 is a perspective view of an exemplary 4-pin connector including the connector unit of FIG. 6 and a mating receptacle unit.
Figure 8:
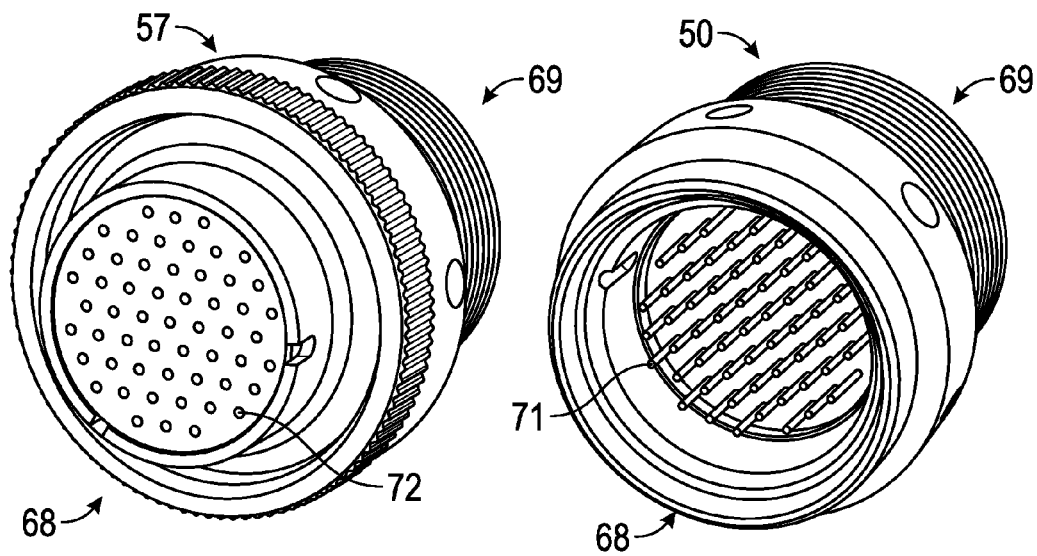
FIG. 8 is a perspective view of another known multi-pin plug and receptacle connector with solder cups which may be plated by the electroplating systems of FIGS. 1 to 5.

For information purposes, typical connectors or "plug" units 50 of a connector 55 are illustrated in FIGS. 6 to 8, with the mating connector or receptacle unit 57 of connector 55 illustrated alongside or aligned with the plug unit in FIGS. 7 and 8. Each connector unit has a forward end 68 designed for mating engagement with the forward end of the mating connector unit, and a rear end 69 where projecting rear ends of the conductors 52 projected for attachment to wires of electrical cables. The electroplating systems of FIGS. 1 to 3 may be used for production plating solder cups 60 at the outer ends of conductors or conductive shafts 52 which extend through a dielectric body or insulator 54 in connector shell 51 and terminate at pin or socket terminals 71, 72 at the mating ends of such connector units. Electroplating may be done either during production, before or after assembly of such connector units into a final instrument housing, or as a rework of faulty solder cups after final production.

Electrical connectors of the type illustrated in FIGS. 6 to 8 are well known and may have any number and different arrangements of electrical pins and sockets, and FIGS. 7 and 8 illustrate examples of two such connectors. During assembly of such connectors into a final product or assembly, the solder cups 60 are soldered to wires or leads 53 of an electrical cable 69, for example as illustrated in FIG. 6. The cable may be inside an instrument housing to connect to a component within the housing, with the terminal ends exposed for connection to a mating connector unit at the end of a cable such as a subsea cable or the like, for electrical communication between the instrument housing and another station or module.

FIG. 7 is a perspective view of an exemplary 4-pin connector. In particular, illustrated are embodiments of a two part underwater connector 55 for connecting optical, electrical, or electro-optical cables. The parts comprise a fixed bulkhead or "plug" unit 50 and a receptacle unit 57 for releasable mating engagement with the plug unit. However, it will be understood that the connectors may be modified for making hybrid electro-optic connections. Additionally, this embodiment of a 4-pin connector illustrated by way of example only, and it will be understood that the connector may alternatively be designed for making a greater or lesser number of connections, depending on the application, with FIG. 8 illustrating a connector with a greater number of pins or connections. In the connectors of FIGS. 6 to 8, the electrical terminals or conductors 52 extend or project out of the rear end of body 54, which may be of glass sealed to the respective conductors 52. Solder cups in the projecting ends of conductors 52 of both plug 50 and receptacle 57 may be electroplated with the electroplating systems of FIG. 1, 2 or 3, with FIGS. 2 and 3 being more appropriate when the connector is assembled into a finished product, and thus includes additional electronics and sensors assembled with the conductors or electrical terminals 52 which require protection and shielding from stray voltages during plating. However, the electroplating system and method described herein is not restricted to electroplating of solder cups of harsh environment connectors, but may be used for electroplating solder cups of any type of electrical connector, as well as holes in other products such as printed circuit boards, as discussed above.

The illustrated electroplating system 200 of FIG. 2 has a needle anode 140 as in FIG. 1. FIG. 2 illustrates three representative solder cups 60 engaged with system components prior to plating. Here, each electrical conductor 52 includes a solder cup 60 similar to the blind hole 31 discussed above. In this configuration, electroplating system 200 may provide for pre-soldering plating operations or production plating, or alternatively for re-plating of faulty solder layers in solder cups of previously manufactured devices which do not support soldering of electrical leads. Although three solder cups are visible in the illustrated embodiment, it will be understood that other solder cups of the connector may be hidden in the side view of FIG. 2, and the same system may be used for electroplating a greater number of solder cups of connector units having a greater number of conductors providing contact pins or receptacles at the opposite end to the solder cups, where the solder cup ends of the electrical conductors project out of the rear end of dielectric body or insulator 54.

Additionally, and as above, this particular configuration is one embodiment, and the illustrated electroplating system 200 may be configured in other embodiments for any combination of singular or plural plating operations (e.g., single or multiple electrical terminals 52), and individual or concurrent plating operations (e.g., single or multiple needle anodes 140). For illustration purposes, portions of the electroplating system 200 have been modified and/or exaggerated for clarity purposes and ease of explanation.

Generally, the electroplating system 200 includes the electric current supply 112, the plating solution supply 120, the needle anode 140, and the positioning device 150 as discussed above in connection with the first embodiment. However, unlike the previous embodiment, the collection device for spent plating solution is not simply positioned beneath the device having holes to be plated, but is instead configured for engagement over the projecting ends 63 of the electrical terminals or conductors 52. In this embodiment, the collection device comprises a catch basin or collection tray 210 having a base wall 212 and peripheral rim 214. The entire basin 210 or at least base wall 212 is formed of a semi-rigid elastomeric and non-conductive material such as rubber. Base wall 212 has a plurality of openings or through holes 215 of slightly smaller diameter than the diameter of terminals 52, and the number and arrangement of holes is designed to match that of the terminals 52. The holes 215 are sealably engaged over the respective terminals 52 as seen in FIG. 2 such that the base wall 212 is positioned just below the lower or inner ends 62 of the respective solder cup. In one embodiment, the collection basin 210 is formed from a rubber or other elastomeric material of sufficient rigidity, such as plumber's rubber or other elastomeric, non-conductive material of around 80 Durometer. Catch basin 210 also has an outlet or drain opening 216 for flow of spent plating material out of basin 210 into discharge passageway 218.

In addition to the catch basin or collection tray 210, the system 200 further comprises a plurality of masking sleeves 220 configured for sealing engagement over the portions of terminals 52 projecting upward or outward through the holes 215 in the base wall 212. These sleeves are also formed of elastomeric, non-conductive material and have diameters slightly less than the diameters of the respective terminals or conductors 52, so that they are a close sealing fit over the outer surface of the conductors surrounding solder cups 60. The catch basin holds the connector unit in a fixed, stable and stationary position during electroplating and may be supported in any suitable support fixture or mounting device (not illustrated). The masking sleeves 220 may be formed integrally with the base wall 212 of basin 210 or may be separate sleeves which slide on over the respective projecting ends of conductors. The sleeves are designed to extend from base wall 212 up to the open ends 65 of the respective solder cups 60. The catch basin shields lower portions of the conductors 52 from the plating solution and insulates the conductors. The sleeves 220 shield the outer surfaces of the projecting ends of shafts 52 to prevent deposition of metal from the plating solution flowing out of the open ends 65 onto the outer surfaces of the solder cup ends of conductors 52.

In this embodiment, needle anode 140 or its insertion portion 144 is configured for electrical terminals 52 with solder cups 60 which have dimensions, aspect ratios, and features within the ranges described above in connection with the blind holes 31 described above in connection with FIG. 1. According to one specific example, the needle anode 140 was a platinum tube of chemically pure material with a wall thickness of approximately 0.006 inch and a diameter of approximately 0.026 inch along its tubular length, and is designed for use in plating operations in which solder cups 60 have a nominal inside diameter of 0.065 inch and a depth of 0.210 inch and having an aspect ratio of 3.2. The needle anode may be of other noble metal materials, and may be of different dimensions depending on the parameters of other solder cups to be electroplated. As discussed above, the needle plating system may be used to plate solder cups having relatively high aspect ratio (i.e. deep and narrow holes), and becomes highly advantageous when the aspect ratio exceeds about 2. The system may be provided with a plurality of needle anodes of different diameter and the appropriate diameter anode may be selected for attachment to the outlet of reservoir 121 depending on solder cup size. As discussed above, the needle anode plating system may be useful for plating of solder cups with aspect ratios in the range of around 2 to 4.

Each solder cup 60 has an interior surface generally defined by an inner wall 61 and a cup bottom 62. Inner wall 61 has a circular cylindrical shape, and each cup bottom 62 is of conical shape, for example, as formed by a drill.

In the illustrated embodiment, each electrical terminal or conductor 52 is separately connected to the plating power supply via current supply lead 132 which has plural contacts or connections 131 to the respective conductors 52 at a location beneath catch basin 210. Since each electrical terminal or conductor 52 is made of conductive metal along its entire length, the cathode connection or contact 131 may be attached to any exposed outer surface of the electrical terminal 52, for example at the pin or receptacle contacts at the opposite end of the connector 50. In the latter case, the contact or connection from lead 132 to the respective conductors may comprise a socket where the mating ends of the conductors are configured as conductive pin contacts, and a pin where the mating ends of the conductors are configured as conductive sockets.

In one embodiment, each electrical terminal 52 to be plated may connected to the power supply negative terminal (making it the cathode) at the time it is plated, and then disconnected when the solder cup plating is completed. For example, each electrical terminal 52 may be individually wired to the electric current supply lead 132 as it is plated, and then unwired. Alternatively, plural electrical terminals 52 may be simultaneously wired to the electric current supply lead 132 during plating operations, and then unwired. The terminals or conductors 52 may be connected together by wrapping a bare copper wire around each one, then leading the wire to the next pin and wrapping it, and so on, until all conductors 52 are daisy chained together, The wire or lead 132 is additionally connected to common node 134 which is grounded to the connector body or housing 51 to insure that all pins or conductors 52 are at zero voltage potential relative to each other and to the sensor housing. This helps to protect components within the electronics module against damage or failure by not imposing any differential voltages between any of the pins or between any of the pins and the housing. Because the plating process is an electrical process, voltages from 1 to 6 volts could be imposed without such an arrangement, which is unacceptable for sensitive devices. By wiring the conductors or pins 52 together and to the housing, this possibility is reduced. Where the connector 50 is assembled into an electronics assembly or module containing sensitive components such as sensors, the electrical terminals 52 may be electrically coupled or grounded to the housing of the electrical component. Furthermore, the common node or junction 134 may be electrically coupled to a ground 70 (grounded) such as an earth ground or a building ground of the plating shop, to eliminate or reduce the risk of electrostatic damage, maintaining common node 134 at zero voltage relative to each constituent electrical coupling. This arrangement also helps to avoid or reduce the risk of stray voltages from the power supply. The insulating shield 210, 220 around the pins isolates the electrified plating solution from the wiring and housing also helps to avoid or reduce the possibility of voltage differences in the bath.

The additional grounding features may be particularly advantageous when operating on assemblies having sensitive instrumentation, for example during rework operations. In particular, since the plating process is an electrical process, uncontrolled voltages on the order of 1 to 6 volts could be imposed in the system. While this may be inconsequential for most plating operations, this may be unacceptable for electroplating a sensitive device. Moreover, the damage could be latent, meaning not detectable by any testing, yet causing premature failure. Here, by protecting against any differential voltages between any of the pins or between any of the pins and the housings, the ongoing reliability of the electrical component may be protected despite the plating process. For example, by wiring the pins and the housings together, potential for damage from uncontrolled voltages may be reduced. Also, by wiring to an earth or building ground, the possibility of electrostatic damage (e.g., from stray voltages from the power supply) may also be reduced.

In one embodiment of electroplating system 200, reservoir 121 was a large 60 ml syringe, open at the top, connected to the needle anode 140, and kept at least half full by topping it off as it drained out. The flow was gravity fed in one embodiment, but constant feed via a pump or the like may be provided in other embodiments. In one example, the flow rate of plating solution was about 30 ml per 5 minutes, which produced a constant "upwelling" type of flow out of the top of the cup being plated. This is sufficient to flush air and bubbles out of the flow path without spewing out of the cup. In one example, electrical current was turned on when the flow of plating solution started. This arrangement avoids a continuous liquid path to large apparatus or pumps or tanks which would then become electrically connected to the plating supply. The syringe reservoir 121 is compact, simple and electrically insulated.

In one embodiment, two different plating solutions were used. The first step is a nickel "strike", which deposits a very thin layer of around 5 micro inches on the internal surface of the solder cup 60. It also electrically cleans, etches and prepares the surface. It is immediately followed with a nickel sulfamate process plating that builds a thicker layer, up to 150 micro inches. This process is used because the sulfamate deposition rate is much faster. It takes a few minutes, where the strike would require hours to achieve the same deposit. The same syringe was used first for the strike solution, until all cups were plated, then the syringe was refilled with the sulfamate solution, and all cups were plated. The cups were kept filled with deionized (DI) water between steps to avoid drying out that could leave oxides and contamination. The sulfamate solution must be maintained at a high temperature, maybe 75 degrees C. To avoid cooling off in the syringe, immersion heater 124 inside the syringe is used to keep the solution warm.

FIG. 3 is a perspective view of one embodiment of the system of FIG. 2 in more detail, and like reference numbers are used for like parts, as appropriate. The XYZ positioner in the embodiment of FIG. 3 is a three axis positioning system having x, y and z positioning slides 310, 312 and 314, respectively, each having a respective x, y or z axis micrometer drive 315, 316, 317, respectively. The reservoir 121 and needle anode 140 are supported on the z-axis positioning slide or platform 314 via support 150 and guide platform 153, respectively. The system of FIG. 3 is designed for manual adjustment of the x, y and z positioning slides, but it will be understood that a corresponding automated system could be provided with controller 113 as in FIG. 2 connected to x, y and z axis drives and programmed for controlling movement of each of the three slides to position needle anode 140 in each solder cup 60 to be plated. In FIG. 3, the XYZ positioner and plating system and a sensor assembly 50 to be replated are supported on a suitable table 318 or other horizontal support surface, with the connector end containing solder cups 60 facing upwards towards the needle anode. The table may have an opening through which part of sensor assembly or instrument module 50 extends, and module 50 may be clamped in position by any suitable fastener or clamp means.

The plating solution catch basin 210 is engaged over the projecting ends of the conductors as illustrated in FIG. 2. In this case, the connector unit has a circle of eight conductors or terminals with solder cups, but other numbers and arrangements of solder cups may be present in other devices with holes or solder cups to be re-plated. The catch basin 210 for this particular solder cup arrangement is illustrated in more detail in FIG. 4, and the lower wall 212 has openings for engagement over the respective terminals or conductors below the solder cup ends, as well as sleeves 220 extending upward from the wall for sealing engagement over exposed outer surfaces of the conductors within basin 210. The drain outlet pipe 218 may be secured to a suitable hose for directing spent plating solution into a suitable container for disposal or recycling purposes As in the embodiment of FIG. 1, needle anode 140 is supported and guided by a plastic part or guide plate 153 attached to the Z-axis positioning slide 314 that also holds the syringe 121, for example as illustrated in FIG. 3, so that these parts all move together. In other words, the syringe, needle, heater when used, needle support, syringe support, and electrical contact band 111 with wire all move together. FIG. 5 illustrates the syringe shaped reservoir 121 and needle anode 140 attachment in more detail. As illustrated in FIG. 5, the outlet end of reservoir 121 and the inlet end of needle anode 140 are secured together via tubular coupling 320 of flexible tubing.

The needle anode moves from cup to cup hummingbird style. At the end of each plating procedure, the needle anode is withdrawn well above the top of the solder cup using the z-axis micrometer drive 317. The x and y axis drive micrometers are then used to move the needle into position over the next cup for plating. The needle is carefully lowered into the cup, and viewed from several angles to insure that it is centered. The indicated position from the micrometer readout is recorded to facilitate repositioning later. An ohm meter may be connected between the grounded pins and the needle contact wire.

When the needle anode is properly positioned and centered over each new solder cup to be plated, it is lowered into the cup using the z axis micrometer of XYZ drive 154 until it touches the bottom of the cup, as indicated by the ohm meter indicating electrical contact. The needle anode is then withdrawn by 0.050" using the z axis micrometer. This setting is recorded for future use. It only varies slightly from pin to pin for a given sensor. The needle stand-off distance is thus about two needle diameters as discussed above.

When in position, the syringe is filled, the power is turned on and the plating solution 90 flows through the anode, out of the discharge end 142, through the gap between the needle anode and inner wall 61 of the solder cup, and out of the open upper end of the cup. As indicated by the arrows in FIG. 2, spent plating solution then flows down the outside of the cup into catch basin or tray 210, and is discharged via outlet 216 to discharge passageway 218 for subsequent collection or disposal.

Once the cup surface is plated to a sufficient thickness, the needle is withdrawn to well above the cup and moved to the next position. The process is repeated for the next solution and plating step, so that all cups are plated twice, once for strike and once for sulfamate. The above process, including handling of the solutions, positioning the needle anode, and starting and stopping flow through the needle anode and power supply to the anode and cathode may be automated and computer controlled in alternative embodiments, and set to run by different programs for connectors with different pin locations, numbers, and patterns.

The process described above may be automated in other embodiments, and different connectors with different pin positions may be separately programmed and automatically plated. The plating could be locally applied by suitable programming only to solder cups with defective solder layers, as needed for soldering or corrosion protection, limiting the amount of gold, chromium, nickel used, and thus limiting spills, vapors and disposal of waste. The above plating method, whether controlled manually or automatically, avoids the need to immerse the entire glass sealed assembly of a finished electrical assembly in strongly ionic chemical plating solutions that tend to infiltrate tiny nooks and crannies where they sometime cannot be cleaned away. If a plating process reduces the electrical insulation between the pins and body, the article is a reject. In the normal plating process, all the wires go in the plating tank in place on the article, and get plated too, and cause irregular surface finish where they touch the pin surface. The process in the above embodiment also removes the concern of entrapped air bubble causing erratic plating coverage in the cup, and more rejects or costly rework. Inspection requirements might also be relaxed.

For connectors in which the solder cup ends of the electrical terminals 52 are recessed within the connector body 51, essentially the same plating system and method may be used to plate the solder cups. In that case, the region between the connector body 51 and the outer ends of the solder cups of the electrical terminals 52 may be filled in with wax, putty, asphalt or other non-conductive, removable sealant up to the open ends of the cups during the plating operations, with the catch basin or collection tray having an opening secured around the connector body. The needle anode can then be lowered into the respective solder cups sequentially and positioned for plating flow in exactly the same way as described above in connection with FIG. 2.

Figure 9:
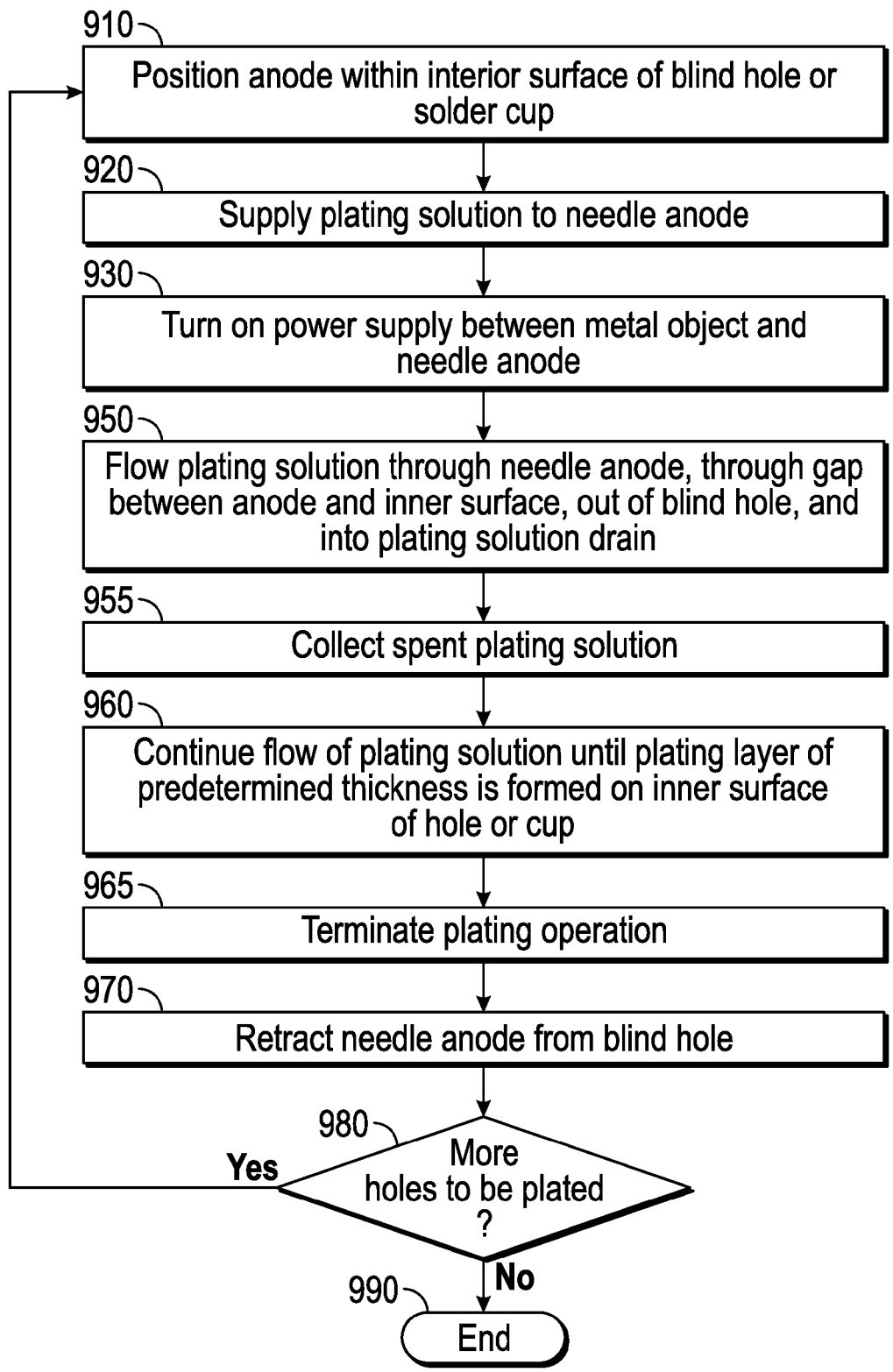
FIG. 9 is a flow chart of an exemplary method for electroplating high aspect ratio holes in connector pins or other workpieces using any of the systems of FIGS. 1 to 5.

FIG. 9 is a flow chart illustrating one embodiment of a method for electroplating high aspect ratio inner surfaces such as solder cups or holes. In particular, the method is directed toward electroplating an interior surface of a blind hole in a metal object such as a solder cup in an electrical terminal, as described above in connection with FIGS. 1, 2 and 3. This method may be applied to rework or repair of existing parts or to production of new parts.

The shape and positioning of the needle anode, as well as the methodology can aid to get a more uniform deposit. This is particularly advantageous, as obtaining solution flow in the solder cup is difficult with conventional methods because the solder cup is only open at one end. Furthermore, bubble entrapment in the solder cup may also restrict uniformity of the deposit.

In the method of FIG. 9, the needle anode 140 is first positioned by the XYZ positioner 154 at a centered position over a solder cup to be plated and then positioned in the cup with discharge end 142 spaced a predetermined distance from the closed end of the cup or hole, as described above in connection with FIGS. 1 to 3 (step 910). Once the needle anode is in the correct position in a cup 60, the power supply to the anode and conductors 52 is turned on (step 930), and plating solution 90 is supplied continuously from reservoir 121 to the inlet end of the needle anode (step 920). The electrical connections may be electrically connected to a ground or grounded as described above, for example, at a common node, to eliminate or reduce the risk of imposition of damaging differential voltages on the electrical terminals and other instrumentation as above by maintaining them all at the same potential.

Plating solution flows continuously during plating through the inner passageway or bore through needle anode, out of discharge end, around the anode through the gap between the anode and inner wall 61 of the cup to be plated, and out of the open upper end 65 of the cup, then traveling down around the protective sleeve 220 covering the outer surface of the sleeve into plating solution drain or collection basin 214 (step 950). Spent plating solution is discharged via outlet 216 and discharge passageway 218 to a suitable collection and disposal device (step 955).

Flow of plating solution through the cup is continued (step 960) until sufficient time has elapsed for an electroplated layer of the desired depth to be deposited on the inner surface (cylindrical wall 61 and inner end 62). Plating flow from reservoir 121 may be provided by pump, gravity feed or other means, as discussed above. The plating operation for the first cup or hole is then terminated (step 965), the power supply between the needle anode and terminal (cathode) is turned off, and the supply of plating solution to the needle anode is terminated. The needle anode 140 is then retracted from the hole or cup to a location well above the top of the solder cup using, for example, the z-axis micrometer drive of the XYZ positioning device (step 970). If there are more holes or solder cups to be plated (step 980), the process is repeated for the next hole or cup to be plated, with the needle anode moved by the XYZ drive or positioning device 154 from solder cup to solder cup hummingbird style. Once all holes or cups which need to be plated are finished, the process ends (990).

The above method may be manually controlled by an operator or alternatively may be automated and computer controlled, and set to run by different programs in a system controller for example. The automation may be programmed for different numbers and locations of solder cups of electrical terminals or holes of a similar nature in other products.

According to one embodiment, the step of supplying plating solution may also include heating the plating solution. In particular, the plating solution may be heated while plating operations are ongoing. For example, the plating solution may be heated using an immersion heater, or other heater as described above, and maintained at a predetermined temperature or within a predetermined range in steps 950 and 960.

The electric current established in the plating solution between the interior surface of the blind hole and the electroplating anode liberates metal from the plating solution, which is then deposited onto the interior surface of the blind hole 960. Gases or other chemicals liberated at the insertion portion of the needle anode are swept away from the plating area by the continuous flow and replacement of the plating solution supplied by the needle anode. The needle anode is formed of material which is not consumed by the electrochemical action of the plating in this step, such as a noble metal, coated ceramic or the like. Thus, the plating solution is the source of the metal to be deposited. Furthermore, the continuous flow and replenishment provides a continuous source of metal for plating, so that the plating operation need not be interrupted until the metal deposition is complete.

FIG. 9 illustrates a plating process in which a single plating layer is applied to the hole surface, but alternative plating methods may include a two or more stage plating process in which different plating solutions apply two or more layers to a single component to be plated, as described above. In particular, a pretreatment plating may be applied prior to the actual or primary plating. Examples of the plural solutions may include Wood's Nickel strike, and sulfamate nickel. The strike may be used for surface preparation and a thin nickel deposition. The sulfamate solution provides for plating to the final desired thickness at a more rapid deposition rate. For example, the first plating operation may be with a nickel "strike", which deposits a very thin layer of approximately 5 microinches. This plating may also electrically clean, etch, and prepare the interior surface. The first plating operation may be immediately followed with a nickel sulfamate process plating, which builds a thicker layer of up to approximately 150 microinches. The two step process is advantageous because the sulfamate deposition rate is much faster, taking a few minutes, where the strike would require hours to achieve the same deposit.

In a two stage plating embodiment, the same plating solution or syringe may be used first for the strike solution, until all solder cups are plated, then the syringe may be refilled with the sulfamate solution, and a second plating layer is then applied to all solder cups in turn. The solder cups may be kept filled with deionized (DI) water between plating rounds to avoid drying out, which could leave oxides and contamination.

In addition to the benefits associated reworking or repairing connectors that are already assembled into components, the electroplating systems and methods described above also offer several significant advantages in production. For example, if the process were automated, different connectors with different pin positions could be separately programmed and automatically plated, with each connector positioned in turn at a plating station 100 or 200 by a conveyor-like system. Also, since the plating could be locally applied only to where needed for soldering or corrosion protection, the amount of gold, chromium, nickel used could be limited. To illustrate, instead of 50 gallons or more of toxic liquid bubbling in multiple vats using conventional plating bath methods, the system and method described above may only require a few gallons of plating solution, thus limiting spills, vapors and disposal of waste.

Also, where the electrical terminals are already installed in glass sealed assembly, this system and method avoids the need to immerse the entire assembly in strongly ionic chemical plating solutions that tend to infiltrate tiny nooks and crannies where they sometimes cannot be cleaned away, resulting in a defective assembly which is then rejected. Although embodiments of the electroplating system 100, 200 are described above for electroplating (nickel plating in this case), the method and system is generally applicable for all plating, electro-cleaning, and electro-polishing applications for deep or high aspect ratio holes or cups.

The elimination of submersion of a product to be plated in a plating bath avoids inadvertent plating of support structure, or the overplating of the component in which the electrical terminals are installed. For example, in conventional bath plating, the cathode lines go in the plating tank along with the article, and are also plated, which may cause irregular surface finish where they touch the electrical terminal surface (e.g., using a conductive support tray). Also, the continuous flow plating process using a needle anode as described above helps to avoid air bubbles described above. Also, inspection requirements might be relaxed. In short, the system and methods disclosed herein present a new approach to electroplating which allows plating of areas which are difficult or impossible to plate uniformly using existing techniques, such as deep, high aspect ratio holes, bores, or cups in metal products such as connector terminals.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

We claim:

1. An apparatus for electroplating an interior surface of at least one hole in an at least partially conductive workpiece, comprising:
    a needle anode of electrically conductive material, the needle anode being of tubular shape having a first end, a second end, and a through bore between the first and second ends, the second end comprising a discharge outlet for discharge of plating solution flowing through the needle anode, at least an insertion portion of the needle anode extending to the discharge outlet being of predetermined diameter less than the cross-sectional dimension of a hole in a workpiece, at least part of the workpiece including the hole being of conductive material;
    a cathode contact configured for electrical connection to a conductive part of the workpiece;
    a plating power supply for electrical connection between the needle anode and cathode contact during electroplating;
    a positioning device configured for moving the needle anode relative to a metal object to be plated between a retracted position in which the insertion portion is spaced from the hole and an operative position in which at least part of the insertion portion of the needle anode extends through an open end of the hole in an operative, coaxial centered position in the hole spaced from an interior surface of the hole to be plated and with the discharge outlet positioned at a predetermined spacing from an inner end of the hole to define a flow path for plating solution between the discharge outlet and inner end of the hole, through an annular space between the interior surface and the needle anode, and out of the open end of the hole;
    a supply of plating solution connected to the first end of the needle anode;
    a spent plating solution collection device below the open end of the hole for collecting spent plating solution flowing out of the open end of the hole;
    wherein the collection device comprises a basin of nonconductive material; and
    wherein the basin has a lower wall, at least the lower wall of the basin being of elastomeric material and having at least one opening of predetermined cross-sectional dimensions less than external cross-sectional dimensions of part of the workpiece having one or more holes to be plated, the opening being configured for sealing arrangement around the workpiece at a location spaced below the open end of the hole.

2. The electroplating system of claim 1, wherein the lower wall of the basin has a plurality of circular openings of predetermined diameter less than the diameter of plural electrical conductors of an electrical connector, the openings being equal in number to the conductors of the electrical connector and configured for sealing engagement over projecting rear ends of respective electrical conductors at a location spaced below the open ends of solder cups at the rear ends of the conductors.

3. The electroplating system of claim 2, further comprising protective sleeves of non-conductive elastomeric material configured for sealing engagement over end portions of electrical conductors projecting through the basin openings, whereby solder solution flowing out of an open end of a solder cup flows over the respective protective sleeve and into the basin.

4. The electroplating system of claim 1, wherein the basin has a lower wall having at least one discharge opening for directing spent plating solution out of the basin.

5. The electroplating system of claim 1, wherein the positioning device comprises an XYZ drive assembly associated with the needle anode, the XYZ drive assembly being configured to move the associated needle anode between the retracted position in which the needle anode is spaced from the hole to be plated and the operative position in which the insertion portion of the needle anode extends coaxially into the hole with the discharge end of the needle anode located at a predetermined distance from an inner end of the hole and the insertion portion defining a space of predetermined width between the outer surface of the needle anode and a surrounding inner surface of the hole to be plated.

6. The electroplating system of claim 5, wherein the XYZ drive assembly is manually operated.

7. The electroplating system of claim 5, further comprising a controller configured to control operation of the XYZ drive assembly.

8. The electroplating system of claim 7, wherein the controller is programmed for automatic control of operation of the XYZ drive assembly for X, Y and Z position adjustments of the needle anode position.

9. The electroplating system of claim 1, wherein the needle anode is of predetermined radius less than the radius of the hole to be plated.

10. The electroplating system of claim 9, wherein the needle anode has a radius which is approximately 60% of the hole radius.

11. The electroplating system of claim 9, wherein the ratio of needle anode radius to hole radius is in the range from around 0.1 to 0.6.

12. The electroplating system of claim 9, wherein the annular space between an outer surface of the insertion portion of the needle anode and an inner surface of a hole to be plated is in the range from 0.01 to 0.04 inches.

13. The electroplating system of claim 1, wherein the predetermined spacing between the needle anode and inner end of the hole in the operative position is approximately two times the diameter of the insertion portion of the needle anode.

14. The electroplating system of claim 13, wherein the predetermined spacing is in the range from 0.04 to 0.06 inches.

15. The electroplating system of claim 1, wherein the needle anode is made of a noble metal.

16. The electroplating system of claim 15, wherein the needle anode is of platinum.

17. The electroplating system of claim 15, wherein the needle anode diameter is in the range from around 0.006 inches to around 0.125 inches.

18. The electroplating system of claim 15, wherein the needle anode diameter is in the range from around 0.01 to 0.04 inches.

19. An electroplating system for electroplating an interior surface of at least one blind hole of conductive material in a workpiece, the electroplating system comprising:
  a first plating current supply lead configured for electrically coupling to a conductive portion of the workpiece such that the interior surface of the blind hole is operable as an electroplating cathode;
  a plating solution supply;
  a conductive tubular anode having opposite first and second ends and an bore extending between the ends, the first end comprising a plating solution inlet fluidly coupled to the plating solution supply and configured to receive the plating solution, and the second end comprising a discharge outlet configured to discharge a flow of the plating solution from the tubular anode;
  a second plating current supply lead electrically coupled to the tubular anode;
  a support for positioning a workpiece having at least one blind hole beneath the tubular anode;
  a positioning device configured to insert an insertion portion of the tubular anode extending up to the discharge outlet through an open end of the blind hole into the blind hole into a plating position in which the outer surface of the tubular anode is spaced from the interior surface of the blind hole and the discharge outlet is at a predetermined spacing from an inner end of the blind hole to define a flow path for plating solution extending from the discharge outlet between the outer surface of the insertion portion of the tubular anode and the interior surface of the blind hole and out of the open end of the hole;
  a plating solution drain configured to receive and collect the plating solution after exiting the open end of the blind hole, at least a portion of the plating solution drain being made of a non-conductive material; and
  wherein the plating solution drain has a lower wall, at least the lower wall of the basin being of elastomeric material and having at least one opening of predetermined cross-sectional dimensions less than external cross-sectional dimensions of part of the workpiece having one or more holes to be plated, the opening being configured for sealing arrangement around the workpiece at a location spaced below the open end of the hole.

20. The electroplating system of claim 19, wherein the workpiece comprises a connector having a connector body and at least first and second electrical terminals installed in the connector body each having an end portion projecting from the connector body and having a blind hole comprising a solder cup to be plated.

21. The electroplating system of claim 20, wherein the first plating current supply lead is electrically coupled to the first electrical terminal and interconnected to a second electrical terminal such that both are electrically held to a common node.

22. The electroplating system of claim 21, wherein the common node of the first electrical terminal and the second electrical terminal is electrically coupled to the connector body and a ground.

23. The electroplating system of claim 19, wherein the positioning device includes a plural-axis machine tool.

24. The electroplating system of claim 19, further comprising a controller programmed to automate at least a portion of the plating operations.

* * * * *